(12) United States Patent
King

(10) Patent No.: US 6,410,859 B1
(45) Date of Patent: *Jun. 25, 2002

(54) ELECTRICAL ASSEMBLY FOR SEMICONDUCTOR DICE

(75) Inventor: Jerrold L. King, Boise, ID (US)

(73) Assignee: Micron Technology, Inc., Boise ID ( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/835,611

(22) Filed: Apr. 9, 1997

Related U.S. Application Data

(63) Continuation of application No. 08/499,931, filed on Jul. 10, 1995, now Pat. No. 5,661,901.

(51) Int. Cl.[7] .................................................. H05K 1/16
(52) U.S. Cl. ........................................ 174/260; 439/65
(58) Field of Search ................................. 174/250, 253, 174/254, 255, 260, 261; 361/708, 716, 803, 735; 439/65; 257/686, 777, 685

(56) References Cited

U.S. PATENT DOCUMENTS

| 3,403,300 A | * | 9/1968 | Horowitz et al. ............. 361/735 |
| 4,764,846 A | * | 8/1988 | Go ............................... 361/708 |
| 5,140,405 A | | 8/1992 | King et al. .................. 257/727 |
| 5,286,417 A | * | 2/1994 | Mahmound et al. ... 252/519.33 |
| 5,438,223 A | | 8/1995 | Higashi et al. ............. 257/774 |
| 5,578,527 A | | 11/1996 | Chang et al. ........... 438/119 X |
| 5,661,042 A | | 8/1997 | Fang et al. ................... 438/17 |
| 5,661,901 A | | 9/1997 | King ........................... 29/830 |
| 5,751,554 A | * | 5/1998 | Williams et al. ........ 174/260 X |

FOREIGN PATENT DOCUMENTS

| EP | 0446112 | * | 9/1991 | .................. 174/255 |

* cited by examiner

*Primary Examiner*—Albert W. Paladini
*Assistant Examiner*—Jeremy Norris
(74) *Attorney, Agent, or Firm*—Stephen A. Gratton

(57) ABSTRACT

A method for mounting and electrically interconnecting a stack of semiconductor dice on edge to a circuit board is provided. The method forms interconnects adapted to mount each die on edge and establish an electrical connection between contact locations on the die (e.g., bond pads) and corresponding connection points on the circuit board. Each interconnect includes a substrate formed of a material such as silicon or ceramic having a low thermal coefficient of expansion (TCE). Trenches are etched or sawed into the substrate and are then filled with a metal to form conductive traces. Each conductive trace includes contact bump for contacting a contact location on a corresponding die. Z-axis conductive adhesives are used to attach the dice to the interconnects and the interconnects to the circuit board.

12 Claims, 3 Drawing Sheets

ELECTRICAL ASSEMBLY FOR SEMICONDUCTOR DICE

CROSS REFERENCE TO RELATED APPLICATIONS

This application is a continuation of application Ser. No. 08/499,931 filed Jul. 10, 1995 U.S. Pat. No. 5,661,901.

FIELD OF THE INVENTION

This invention relates to semiconductor devices and more particularly to an improved method for mounting and electrically interconnecting unpackaged semiconductor dice.

BACKGROUND OF THE INVENTION

Microelectronic packages called "multi chip modules" (MCMs) are constructed with unpackaged semiconductor dice. With a multi chip module, a number of dice are attached to a printed circuit board or other mounting substrate and electrically connected to form various circuits and electronic devices.

One reason for the increased use of multi chip modules is increased system performance. In particular, integrated circuits on multi chip modules can be operated with lower resistances and parasitic capacitances. This is largely a result of decreasing the interconnection length between the dice included in the multi chip module. In addition, overall system performance is improved because the input/output ports can be configured to access the whole module, which can be organized to reduce signal delays and access times. The power requirements are also reduced due to a reduction in the driver requirements.

Typically the unpackaged dice are mounted on a circuit board having an interconnect pattern formed using a process such as screen printing. Different techniques are used for mounting the dice to the board and for providing interconnection and termination of the unpackaged dice. One such technique is referred to as "flip chip bonding". With flip chip bonding, each die is mounted circuit side down, and bond pads on the die are bonded to corresponding connection points on the circuit board. Flip chips are formed similarly to conventional dice but require an additional process step to form solder bumps on the bond pads. Other techniques for mounting the unpackaged dice to the circuit board include wire bonding, tape automated bonding (TAB) and microbump bonding.

In general, with each of these methods the full surface area of the dice (i.e., circuit side or back side) occupies a corresponding area on the circuit board. As is apparent this uses a large surface area of the circuit board. It would be desirable to effect an interconnection between the dice and circuit board in which less surface area is required. This would allow a higher packaging density for the dice.

Another important consideration in constructing multi chip modules is the electrical connection between the bond pads of the unpackaged dice and the connection points on the circuit board. It is important that these electrical connections provide a low resistance or ohmic contact. It is also important to minimize the effect of thermal expansion on the electrical connections. For example, if the dice and the circuit board expand by a different amount, stress can develop at the connection points and compromise the connection.

In view of the foregoing, it is an object of the present invention to provide an improved method for mounting and electrically interconnecting unpackaged semiconductor dice to a circuit board.

It is a further object of the present invention to provide an improved method for interconnecting dice in which a high device density and a reliable electrical connection can be achieved.

It is yet another object of the present invention to provide an improved method for interconnecting dice which can be used with conventional semiconductor dice having flat bond pads.

Other objects, advantages and capabilities of the present invention will become more apparent as the description proceeds.

SUMMARY OF THE INVENTION

In accordance with the present invention, an improved method for mounting and electrically interconnecting semiconductor dice on a supporting substrate, such as a printed circuit board, is provided. The method includes forming a plurality of interconnects on a wafer and then singulating the interconnects by saw cutting along streets of the wafer. Each interconnect is adapted to mount a die on edge to the circuit board. In addition, each interconnect establishes an electrical connection between contact locations on the die (e.g., bond pads) and corresponding connection points on the circuit board.

The wafer and interconnects include a substrate formed of a material such as silicon or alumina, having a low thermal coefficient of expansion (TCE) that matches that of a silicon die. Trenches are etched or sawn into the substrate, insulated with an insulating layer, and then filled with a conductive material to form conductive traces. In the case of sawed trenches, the conductive material would not necessarily cover the length of the trench. Each conductive trace includes a contact bump corresponding to a contact location on the die. In addition, each conductive trace includes an edge portion corresponding to a connection point on the circuit board.

Multiple dice and interconnects are subassembled and then mounted to a circuit board to form a stacked array. For mounting the dice and interconnects to the circuit board, each die is mounted face down on an interconnect with the contact locations on the die in electrical contact with the contact bumps on the interconnect. A z-axis anisotropic conductive adhesive can be used to secure each die to its corresponding interconnect and to provide an electrical connection therebetween. The die-interconnect subassemblies are then placed together in a stacked array of dice and interconnects with the interconnects supporting the dice on edge. A z-axis conductive adhesive, is again used to secure the interconnects to the circuit board and to establish an electrical connection therebetween. With this arrangement, the conductive traces formed on the interconnects provide a circuit path between the connection points on the circuit board and the contact locations on the dice.

DETAILED DESCRIPTION OF THE PREFERRED EMBODIMENTS

Figure 1:
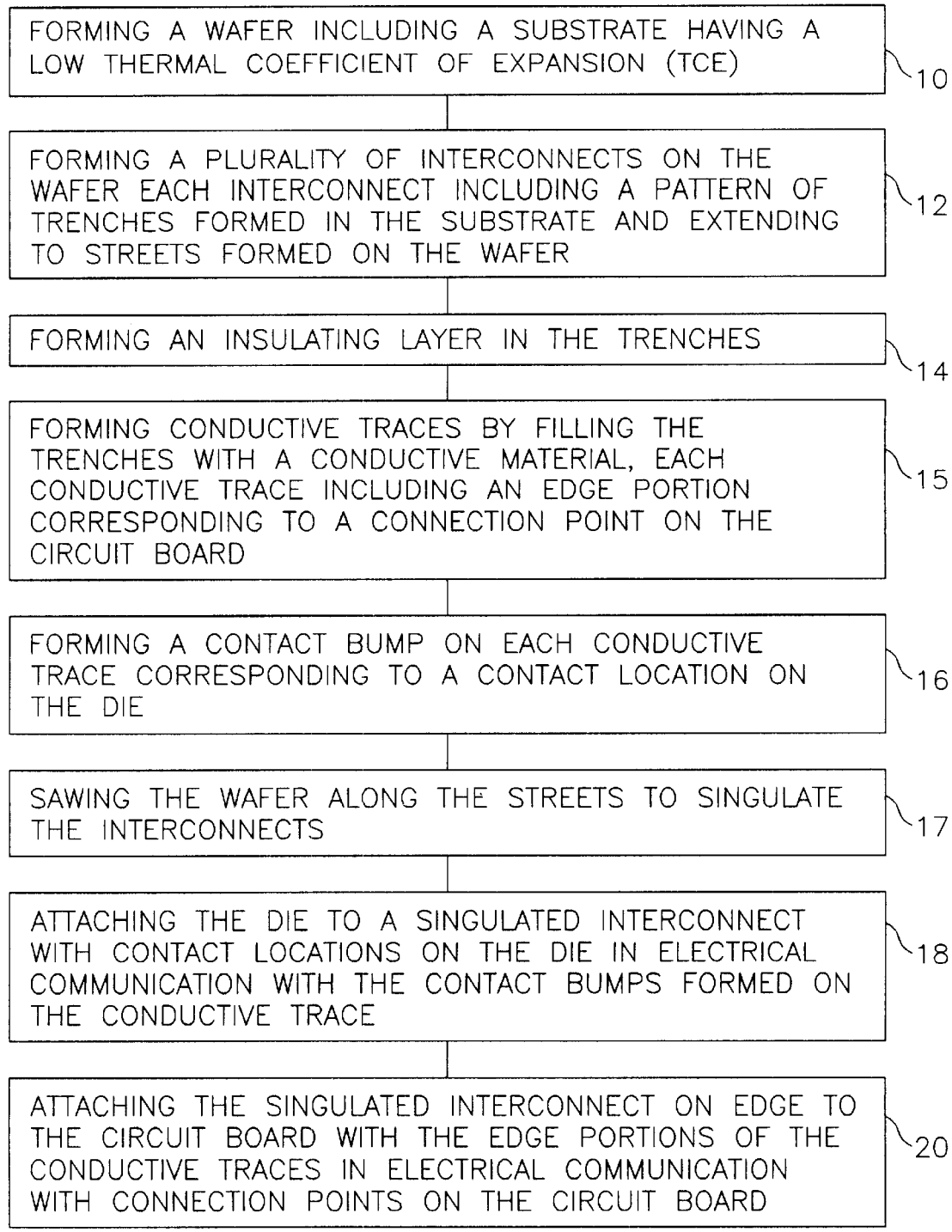
FIG. 1 is a flow diagram illustrating steps included in the method of the invention.

With reference to FIG. 1, a method for mounting and electrically interconnecting an unpackaged semiconductor die to a circuit board includes the steps of:

forming a wafer including a substrate having a low thermal coefficient of expansion (TCE), step 10;

forming a plurality of interconnects on the wafer each interconnect including a pattern of trenches formed in the substrate and extending to streets formed on the wafer, step 12;

forming an insulating layer in the trenches, step 14;

forming conductive traces by filling the trenches with a conductive material, each conductive trace including an edge portion corresponding to a connection point on the circuit board, step 15;

forming a contact bump on each conductive trace corresponding to a contact location on the die, step 16;

sawing the wafer along the streets to singulate the interconnects, step 17;

attaching the die to a singulated interconnect with contact locations on the die in electrical communication with the contact bumps formed on the conductive traces, step 18; and attaching the singulated interconnect on edge to the circuit board with the edge portions of the conductive traces in electrical communication with connection points on the circuit board, step 20.

Figure 2:
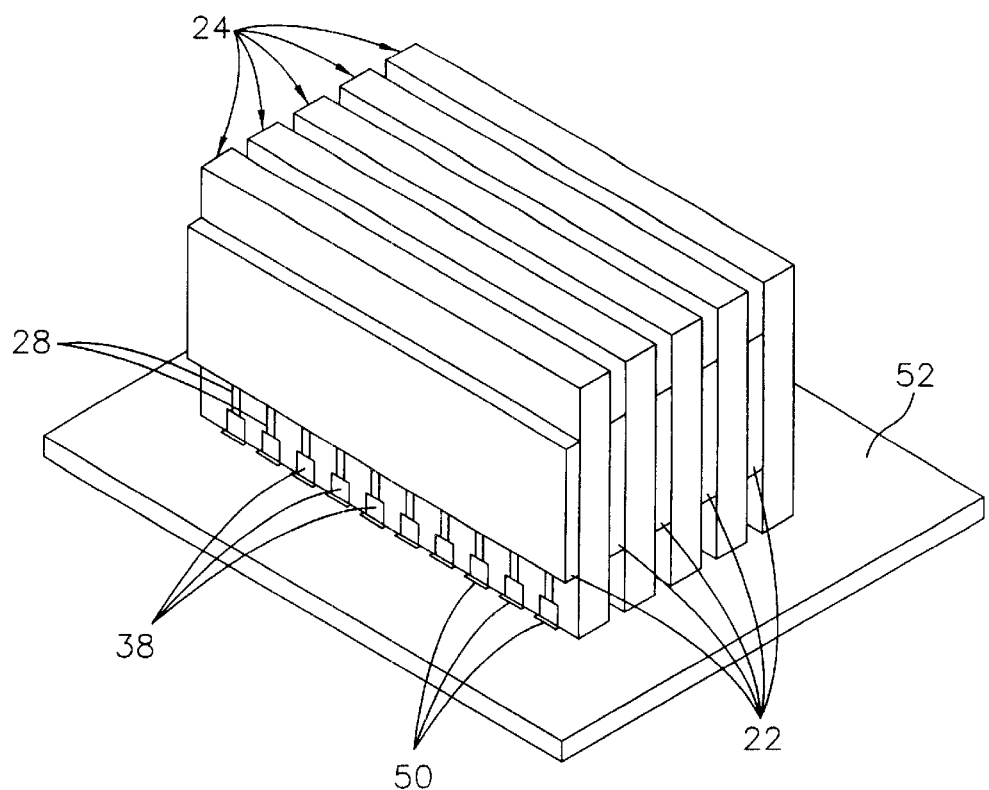
FIG. 2 is a perspective view of semiconductor dice mounted on edge to a circuit board using interconnects constructed in accordance with the invention.

Referring now to FIG. 2, a stack of semiconductor dice 22 are mounted to a circuit board 52 using interconnects 24 constructed in accordance with the invention. The dice 22 and interconnects 24 are mounted on edge in a stacked array. Each die 22 is attached to an interconnect 24 and each interconnect 24 is attached to the circuit board 52.

Figure 3A:
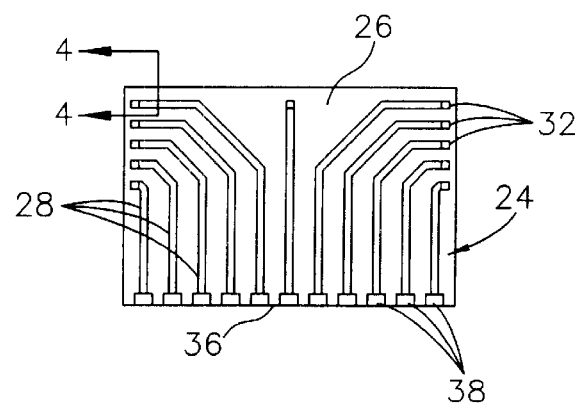
FIG. 3A is a plan view of an interconnect constructed in accordance with the invention.
Figure 3B:
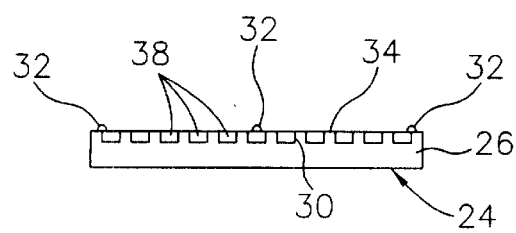
FIG. 3B is a side elevation view of FIG. 3A.

An interconnect 24 is shown separately in FIGS. 3A and 3B. The interconnect 24 includes: a substrate 26; conductive traces 28 formed in trenches 30 (FIG. 3B) in the substrate 26; contact bumps 32 formed on the conductive traces 28; and edge portions 38 formed on the conductive traces 28 along an edge of the interconnect 24.

The substrate 26 is formed of a material having a thermal coefficient of expansion (TCE) that closely matches the TCE for a silicon die. Suitable materials include semiconducting materials such as monocrystalline silicon, polycrystalline silicon, silicon-on-sapphire, silicon-on-glass, and germanium. Another suitable material is a ceramic such as alumina. In addition to having a low TCE that matches the TCE of a silicon die, these materials can be processed using semiconductor fabrication techniques (e.g., etching, oxidation growth, etc.).

Each interconnect 24 is generally rectangular in shape and includes a front surface 34 (FIG. 3B) wherein the trenches 30 and conductive traces 28 (FIG. 3A) are formed. In the illustrative embodiment, each interconnect 24 is formed with a length substantially equal to that of the die 22 and with a width that is slightly larger than the width of the die 22. This provides a surface area for the front surface 34 which is approximately 14 to 28 square mils.

Each interconnect 24 also includes an edge 36 (FIG. 3A) wherein the edge portions 38 of the conductive traces 28 are formed. Preferably a large number of interconnects 24 are formed on a wafer (not shown) and are then singulated using a process such as saw cutting. The edge 36 corresponds to a saw cut or "street" of the wafer.

The trenches 30 (FIG. 3B) for the conductive traces 28 can be formed by etching the substrate 26 or alternately by saw cutting the substrate 26. Preferably, the etch process can be controlled to make the trenches 30 larger for the edge portion 38. Etching can be a wet or dry, isotropic or anisotropic, etch process. Such an etch process can be accomplished by forming a photomask (not shown), or a hard mask (not shown), on the substrate 26 using a photolithographic process (e.g., photoresist deposition, exposure and development). Using the photomask, or hard mask, the substrate 26 can then be etched to form the trenches 30. By way of example, a substrate 26 formed of monocrystalline silicon can be anisotropically etched using a solution of KOH and $H_2O$ or isotropically etched using a solution of HF, $HNO_3$ and $H_2O$.

Figure 4:
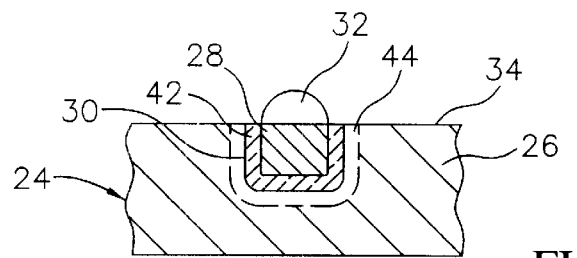
FIG. 4 is an enlarged cross sectional view taken along section line 4—4 of FIG. 3A.
Figure 4A:
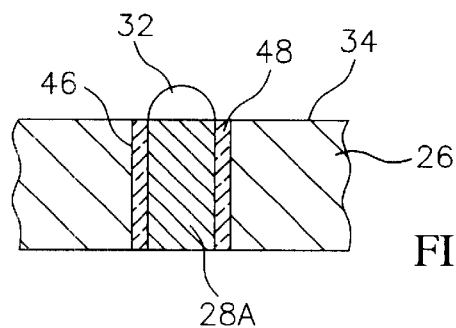
FIG. 4A is an enlarged cross sectional view equivalent to FIG. 4 of an alternate embodiment interconnect formed with through trenches.

In the illustrative embodiment, and as shown in FIG. 4, the substrate 26 is etched to a predetermined depth to form the trenches 30. The trenches 30 are then filled with a conductive metal to form the conductive traces 28. Alternately, as shown in FIG. 4A, the substrate 26A can be etched completely through to form through openings 46 rather than trenches 30 (FIG. 4). As will be more fully explained, the through openings 46 can be more easily filled with a conductive metal using an electrodeposition process.

In the illustrative embodiment, the trenches 30 are formed with edge portions 38 having a diameter (i.e., width) and a spacing (i.e., pitch) that corresponds to the width and spacing of bond pads 40 on the semiconductor die 22. By way of example and not limitation, the edge portions 38 of the trenches can be on the order of about 40 $\mu$m to 250 $\mu$m and the spacing on the order of about 50 $\mu$m to 150 $\mu$m. A depth of the trenches 30 will be on the order of about 100 $\mu$m to 350 $\mu$m.

Following formation of the trenches 30 and as shown in FIG. 4, an insulating layer 42 is formed on the sidewalls and bottom surface of the trenches 30. The insulating layer 42 is preferably an oxide such as $SiO_2$ that can be formed by an oxidation growth process or by a deposition process such as CVD. By way of example, TEOS (tetraethylorthosilane) can be used to grow $SiO_2$ at a temperature of about 400° C. A representative thickness for the insulating layer 42 is from about 500 Å to 6000 Å. FIG. 4A illustrates an insulating layer 48 formed on the alternate embodiment having a through opening 46.

The purpose of the insulating layer 42 (or 48) is to electrically isolate the conductive traces 28 formed in the trenches 30 from the remainder of the substrate 26. A channel stop 44 (FIG. 4) can also be employed in place of, or in addition to, the insulating layer 42 to electrically isolate the conductive traces 28. By way of example, for a substrate 26 formed of P-type silicon, the channel stop 44 can be formed by doping the substrate 26 with an n-type dopant such as phosphorus or arsenic. In some cases, particularly with a substrate 26 formed of an insulating material such as a ceramic, an insulating layer is not required.

Still referring to FIG. 4, following formation of the insulating layer 42 the conductive traces 28 are formed by depositing a conductive metal within the trenches 30. The conductive traces 28 can be formed of any metal deposited by any suitable deposition process. Exemplary metals include nickel, aluminum, tungsten, molybdenum, copper, titanium, platinum, or an alloy of these or other metals. Suitable deposition processes include sputtering, CVD, electron beam deposition, electroplating and electroless deposition. In addition, wave soldering techniques similar to those employed for forming patterned conductive lines for printed circuit boards can also be employed to form the conductive traces 28. FIG. 4A illustrates a conductive trace 28A formed in the through opening 46.

Preferably, the conductive traces 28 (or 28A) are formed with an exposed upper surface that is co-planar with the front surface 34 of the substrate 26. The conductive traces 28 can be initially deposited to be substantially co-planar to the front surface 34 or can be deposited with excess material and then planarized following deposition. A suitable method of planarization is with chemical mechanical planarization (CMP). Other methods of planarization such as an etch back process using a dry etch or reverse electroplating can also be employed.

As also shown in FIG. 4, the conductive traces 28 include the contact bumps 32 formed at one end for establishing electrical contact with the bond pads 40 (FIG. 5) on the die 22. FIG. 3A shows the relative locations of the contact bumps 32 on the conductive traces 28. These locations would correspond to the locations of the bond pads 40 on the die 22. The contact bumps 32 are formed of a conductive metal such as tungsten deposited on the conductive traces 28 using a process such as electrodeposition or CVD. The contact bumps 32 have a diameter of about 25 μm to 75 μm. These contact bumps 32 are similar in size and shape to the solder bumps formed on bumped die used for flip chip bonding.

Figure 5:
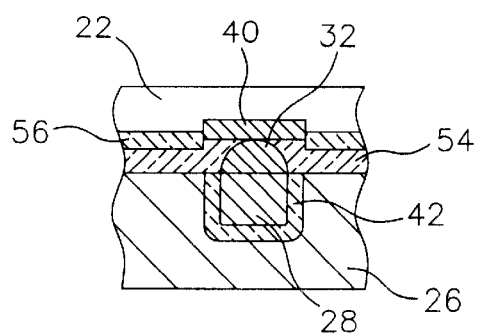
FIG. 5 is a cross sectional view illustrating a contact bump of an interconnect electrically engaging a contact location on a semiconductor die.

After fabrication of the interconnect 24 using the above outlined process, a plurality of interconnects 24 and dice 22 can be assembled in a stacked array as shown in FIG. 2. Initially, each die 22 is attached to a respective interconnect 24 using a conductive material. Suitable conductive materials are conductive adhesives, z-axis anisotropic adhesives, and solder. This is shown in FIG. 5. In FIG. 5 the semiconductor die 22 includes a bond pad 40 embedded in a passivation layer 56. The bond pad 40 is placed in alignment with a contact bump 32 formed on a conductive trace 38 of the interconnect 24 as previously described. The contact bump 32 and bond pad 40 can be placed in alignment using a vision system and techniques employed for flip chip alignment. By way of example, an aligner bonder tool such as described in U.S. Pat. No, 4,899,921 to Bendat et al. incorporated herein by reference, can be used to align the contact bumps 32 on the interconnect 24 with the bond pads 40 on the die 22.

A z-axis anisotropic adhesive 54 is used to secure the die 22 to the interconnect 24 and to establish an electrical connection between the bond pads 40 on the die and the contact bumps 32 on the interconnect. Z-axis anisotropic adhesives are filled with conductive particles which do not contact each other in the x-y plane. Compression in the z-direction establishes an electrical path. Z-axis anisotropic adhesives are formed as a viscous paste or as a film that is applied and then cured under compression to harden.

Suitable z-axis anisotropic adhesives are sold under the trademarks: "X-Poly™" and "Z-PolY™", by A.I. Technology, Trenton, NJ; and "Shel-Zac™" by Sheldahl, Northfield, Minn. Z-axis anisotropic adhesives are also sold by 3M, St. Paul, Minn.

The z-axis anisotropic adhesive 54 can be deposited on the contact bump 32 or bond pad 40 using a suitable process. For a z-axis anisotropic adhesive 54 formed as a viscous paste, a screen printing process can be used. A z-axis anisotropic adhesive 54 formed as a film can be cut in a required pattern and then placed into contact with the contact bump 32 and bond pad 40.

Figure 6:
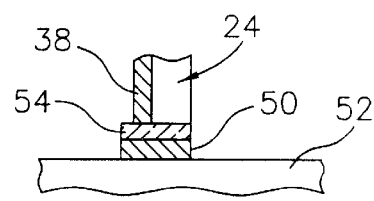
FIG. 6 is a cross sectional view illustrating an edge portion of the interconnect electrically connected to a connection point formed on the circuit board.

Following attachment of each die 22 to a respective interconnect 24, a stacked array of interconnects is formed as shown in FIG. 2. The interconnects 24 are attached on edge to the circuit board 52 again using a z-axis anisotropic adhesive 54. The z-axis anisotropic adhesive 54 also establishes an electrical connection between connection points 50 on the circuit board 52 and the edge portions 38 of the conductive traces 28. The connection points 50 can be formed as flat or raised metal pads which are in electrical communication with printed circuits and electrical components formed on the circuit board 52. FIG. 6 is an enlarged cross sectional view illustrating an edge portion 38 of a conductive trace 28 for the interconnect 24 in electrical communication with a connection point 50 on the circuit board 52. Using this arrangement, an electrical path is established from the electrical circuits on the circuit board 52, through the connection pad 50 on the circuit board 52, through the z-axis anisotropic adhesive 54, through the edge portions 38 of the conductive traces 28 (FIG. 2), through the conductive traces 28, through the contact bumps 32 on the conductive traces 28 and to the bond pads 40 on the die 22.

The invention thus provides an improved method for mounting and electrically interconnecting unpackaged semiconductor dice on edge to a circuit board. While the invention has been described with reference to certain preferred embodiments, as will be apparent to those skilled in the art, certain changes and modifications can be made without departing from the scope of the invention as defined by the following claims.

What is claimed is:

1. An electrical assembly comprising:
   a substrate comprising a surface and a plurality of electrical connection points on the surface;
   an interconnect comprising an edge, a second surface and a plurality of conductive traces comprising electrically insulated trenches in the second surface and the edge at least partially filled with a conductive material, the traces substantially co-planar with the second surface and including edge portions in the edge, the interconnect mounted on the edge to the substrate with the edge portions of the conductive traces in electrical communication with the connection points;
   a conductive material on the edge attaching the interconnect to the surface and electrically connecting the edge portions of the conductive traces to the connection points;
   a semiconductor die comprising a face and a plurality of contacts on the face, the die mounted face down on the second surface with the contacts bonded to the conductive traces; and
   a second interconnect and a second die attached to the substrate to form a stacked array in which the interconnect and the second interconnect are in physical contact with and separated by the second die.

2. The electrical assembly of claim 1 wherein the interconnect and the second interconnect comprise silicon.

3. The electrical assembly of claim 1 wherein the interconnect and the second interconnect comprise silicon and the trenches comprises $SiO_2$.

4. The electrical assembly of claim 1 further comprising a plurality of contact bumps on the conductive traces bonded to the contacts on the die.

5. An electrical assembly comprising:
- a substrate comprising a plurality of electrical connection points;
- a silicon interconnect on the substrate comprising a surface, an edge, and a plurality of conductive traces comprising trenches in the surface and in the edge, at least partially filled with a conductive material substantially co-planar with the surface, the silicon interconnect mounted on the edge to the substrate, with edge portions of the conductive traces electrically attached to the connection points;
- a conductive material on the edge electrically attaching the edge portions to the connection points;
- a semiconductor die flip chip mounted to the surface comprising a plurality of contacts in electrical communication with the conductive traces; and
- a second silicon interconnect and a second die attached to the substrate to form a stacked array in which the silicon interconnect and the second silicon interconnect are in physical contact with and separated by the second die.

6. An electrical assembly comprising:
- a substrate comprising a plurality of electrical connection points;
- a plurality of interconnects on the substrate comprising surfaces, edges, and conductive traces comprising electrically insulated trenches in the surfaces and the edges at least partially filled with a conductive material and having edge portions in the edges;
- a conductive adhesive on the edges attaching the interconnects to the substrate and electrically connecting the edge portions to the connection points;
- a plurality of semiconductor dice on the surfaces comprising a plurality of contacts bonded to the conductive traces;
- the dice and the interconnects forming a stacked array on the substrate in which each interconnect is mounted on an edge to the substrate and separated from an adjacent interconnect by a die in physical contact with the adjacent interconnect.

7. The electrical assembly of claim 6 wherein the conductive traces and the surfaces are substantially planar.

8. The electrical assembly of claim 6 further comprising a plurality of metal bumps on the conductive traces bonding the contacts on the dice to the conductive traces on the interconnects.

9. The electrical assembly of claim 6 further comprising a second conductive adhesive bonding the dice to the interconnects and electrically connecting the contacts on the dice to the conductive traces on the interconnects.

10. An electrical assembly comprising:
- a substrate comprising a plurality of electrical connection points;
- a plurality of silicon interconnects mounted on edge to the substrate in a stacked array, the silicon interconnects comprising surfaces, edges, and conductive traces substantially planar to the surfaces and comprising edge portions in the edges;
- a conductive adhesive along the edges of the silicon interconnects attaching the silicon interconnects to the substrate and electrically connecting the edge portions of the conductive traces to the connection points;
- a plurality of semiconductor dice flip chip mounted to the surfaces of the silicon interconnects and comprising a plurality of contacts bonded to the conductive traces;
- the dice and the silicon interconnects forming a stacked array on the substrate in which each silicon interconnect is mounted on an edge to the substrate and separated from an adjacent silicon interconnect by a die in physical contact with the adjacent silicon interconnect.

11. The electrical assembly of claim 10 further comprising a second conductive adhesive bonding the contacts on the dice to the conductive traces on the silicon interconnects.

12. The electrical assembly of claim 10 further comprising a plurality of metal bumps on the conductive traces bonded to the contacts on the dice.

* * * * *